(12) United States Patent
Hongo et al.

(10) Patent No.: US 6,517,894 B1
(45) Date of Patent: Feb. 11, 2003

(54) METHOD FOR PLATING A FIRST LAYER ON A SUBSTRATE AND A SECOND LAYER ON THE FIRST LAYER

(75) Inventors: Akihisa Hongo, Tokyo (JP); Mizuki Nagai, Tokyo (JP); Kanji Ohno, Kanagawa (JP); Ryoichi Kimizuka, Tokyo (JP); Megumi Maruyama, Kanagawa (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 09/674,179

(22) PCT Filed: Apr. 28, 1999

(86) PCT No.: PCT/JP99/02271

§ 371 (c)(1),
(2), (4) Date: Oct. 27, 2000

(87) PCT Pub. No.: WO99/57342

PCT Pub. Date: Nov. 11, 1999

(30) Foreign Application Priority Data

Apr. 30, 1998 (JP) ............................................. 10-136151
Apr. 30, 1998 (JP) ............................................. 10-136152

(51) Int. Cl.$^7$ ............................ B05D 5/12; C25D 5/02; H01L 21/44
(52) U.S. Cl. ........................ 427/97; 205/123; 205/125; 205/126; 205/183; 438/643; 438/668; 438/672; 438/674; 438/687
(58) Field of Search ................................ 438/627, 629, 438/643, 653, 667, 668, 672, 674, 687; 205/123, 125, 126, 157, 182, 183, 186, 187; 427/97

(56) References Cited

U.S. PATENT DOCUMENTS

| | | |
|---|---|---|
| 3,716,462 A | 2/1973 | Jensen |
| 3,930,963 A | 1/1976 | Polichette et al. |
| 4,959,278 A | 9/1990 | Shimauchi et al. |
| 5,116,430 A | 5/1992 | Hirai et al. |
| 5,151,168 A | 9/1992 | Gilton et al. |
| 5,209,817 A | 5/1993 | Ahmad et al. |
| 5,549,808 A * | 8/1996 | Farooq et al. ............... 205/123 |
| 5,639,316 A | 6/1997 | Cabral, Jr. et al. |
| 5,882,498 A * | 3/1999 | Dubin et al. ................. 205/261 |
| 5,913,147 A | 6/1999 | Dubin et al. |
| 5,933,758 A * | 8/1999 | Jain ........................... 438/687 |
| 5,989,623 A * | 11/1999 | Chen et al. .................... 427/97 |
| 6,020,266 A * | 2/2000 | Hussein et al. .............. 438/694 |
| 6,140,234 A * | 10/2000 | Uzoh et al. .................. 438/678 |
| 6,277,263 B1 | 8/2001 | Chen |
| 6,290,833 B1 | 9/2001 | Chen |
| 6,197,181 B1 * | 3/2002 | Chen .......................... 205/123 |

FOREIGN PATENT DOCUMENTS

| | | |
|---|---|---|
| JP | 53-53527 | 5/1978 |
| JP | 143971 * | 12/1978 |
| JP | 53-143971 | 12/1978 |
| JP | 62-276893 | 12/1987 |
| JP | 5-140795 | 6/1993 |
| JP | 7-41991 | 2/1995 |

OTHER PUBLICATIONS

Translation of JP 5–140795 (Jun. 1993).
Translation of JP 62–276893 (Dec. 1987).
Translation of JP 53–53527 (May 1978).
Translation of JP 53–143971 (Dec. 1978).
Translation of JP 07–41991 (Feb. 1995).

* cited by examiner

*Primary Examiner*—Brian K. Talbot
(74) *Attorney, Agent, or Firm*—Wenderoth, Lind & Ponack, L.L.P.

(57) ABSTRACT

A method and apparatus for plating a substrate is provided, wherein fine pits formed in the substrate, such as fine channels for wiring, are filled with a copper, copper alloy, or other material with low electrical resistance. The method is performed on a wafer W having fine pits (10) to fill the fine pits with a metal (13) and includes performing a first plating process (11) by immersing the wafer in a first plating solution having a composition superior in throwing power; and performing a second plating process (12) by immersing the substrate in a second plating solution having a composition superior in leveling ability.

125 Claims, 5 Drawing Sheets

METHOD FOR PLATING A FIRST LAYER ON A SUBSTRATE AND A SECOND LAYER ON THE FIRST LAYER

TECHNICAL FIELD

The present invention relates to a substrate plating method and apparatus, and particularly to a substrate plating apparatus for filling pits for fine wires and the like formed in a semiconductor wafer with copper or another metal.

BACKGROUND ART

Conventionally, wire channels have been formed in a semiconductor wafer by first depositing a conducting layer on the wafer surface using sputtering or a similar technique. Next, the unnecessary portions of the conducting layer are removed through a chemical dry etching process with a pattern mask formed of resist or the like.

In conventional processes, aluminum (Al) or an aluminum alloy has been used to form the wire circuit. However, wiring has been made thinner to keep up with the increased complexity of semiconductor devices. The increasing current density generates increased thermal stress and higher temperatures. This causes stress-migration or electro-migration, which grow more remarkable as the layers of aluminum or the like are manufactured thinner and give rise to such disorders as wire breakage or short-circuiting.

To avoid an excessive generation of heat in the wiring, a metal having a higher conductivity such as copper is required to form the wiring. However, it is difficult to perform dry etching on copper or a copper alloy that has been deposited over the entire surface as in the process described above. An alternative process would be to first form channels for the wiring according to a predetermined pattern and then fill the channels with copper or a copper alloy. This method eliminates the process of removing unnecessary parts of the conductive layer by etching, requiring only that the surface of the wafer be polished to remove uneven areas. The method has the additional benefit of being able to form simultaneously multiple areas called plugs that connect the tops and bottoms of channels.

However, the shape of these wiring channels and plugs have a considerably high aspect ratio (the ratio of depth to width) as the width of the wiring gets smaller, making it difficult to fill the channels with an even layer of metal using sputtering In deposition. The chemical vapor deposition method (CVD) has been used for depositing various materials, but it is difficult to prepare an appropriate gas material for copper or a copper alloy. Further, when using an organic material, carbon from the material becomes mixed in with the deposition layer and increases the resistance.

Therefore, a method was proposed for performing electroless or electrolytic plating by immersing a substrate into a plating solution. With this method, it is possible to fill wire channels having a high aspect ratio with a uniform layer of metal.

When performing an electrolytic plating process, for example, generally a plating solution having a composition including copper sulfate and sulfuric acid is used. If the solution has a low concentration of copper sulfate and a high concentration of sulfuric acid, it is known that the plating solution will have high conductivity and great polarization, thereby improving throwing power and coating uniformity. In contrast, if the plating solution has a high concentration of copper sulfate and a low concentration of sulfuric acid, it is known that through the work of an additive the solution will have good leveling ability, in other words, plating will grow from the bottom of the fine pits formed in the substrate surface.

For this reason, performing a plating process using a plating solution having a composition superior in throwing power and coating uniformity to fill copper in the fine pits of a substrate having a large aspect ratio, the leveling ability of the solution is poor. The inlets of the fine pits will be blocked first before the pits are filled, thereby tending to form voids in the pits. On the other hand, using a plating solution with a composition superior in leveling ability will be inferior in throwing power and coating uniformity, resulting in unplated areas on the walls and bottoms of the fine pits.

Generally in these plating processes, a copper seed layer is formed on the bottom surface and area surrounding the fine pits of the substrate. However, when performing electrolytic plating directly on a barrier layer, such as TiN or TaN, the sheet resistance of the barrier layer is much larger than the resistance of the copper sulfate plating solution. As a result, needle-shaped crystals are formed in plating processes using copper sulfate solution, resulting in a plating layer having loose adherence.

In addition a copper pyrophosphate plating solution is also widely used because of its close adhesion due to high polarization and layered deposition property. However, copper pyrophosphate plating solution has poor leveling ability. Hence, when filling fine pits with copper in a plating process using copper pyrophosphate plating solution, the inlets to the fine pits become blocked first, thereby developing voids, as described above. Of course, it is also possible to use copper pyrophosphate plating solution as a first layer over a copper seed layer.

DISCLOSURE OF INVENTION

In view of the foregoing, it is an object of the present invention to provide a method and apparatus of plating a substrate capable of filling fine pits of channels and the like for fine wiring with copper, a copper alloy, or similar material having a low electrical resistance, such that the plating is uniform with no gaps and has a smooth surface.

These objects and others will be attained by a method for plating a substrate having a surface with fine pits formed therein, the method comprising; performing a first plating process by immersing the substrate in a first plating solution having a composition superior in throwing power; and performing a second plating process by immersing the substrate in a second plating solution having a composition superior in leveling ability.

With this method, a uniform initial plating layer without unplated areas on the side walls and bottom of the fine pits is formed in the first plating process. A surface plating layer having a smooth surface and no void is formed on top of the initial plating layer in the second plating process.

According to another aspect of the present invention, the first plating solution is a high throwing power copper sulfate plating solution for printed circuit boards and the second plating solution is a copper sulfate solution. The high throwing power copper sulfate plating solution has a low concentration of copper sulfate, a high concentration of sulfuric acid, and is therefore superior in throwing power and coating uniformity. The copper sulfate plating solution has a high concentration of copper sulfate and a low concentration of sulfuric acid and is superior in leveling ability. As a result, plating metal is uniformly deposited on the surface of the semiconductor wafer, eliminating unplated areas formed on the side and bottom surfaces of the fine pits.

According to another aspect of the present invention, the high throwing power copper sulfate plating solution has a composition of 5–100 g/l of copper sulfate and 100–250 g/l of sulfuric acid, and the copper sulfate solution has a composition of 100–300 g/l of copper sulfate and 10–100 g/l of sulfuric acid.

According to another aspect of the present invention, a method for plating a substrate having a surface with fine pits formed therein and coated with a barrier layer, comprises; performing a first plating process by immersing the substrate in a first plating solution having a composition superior in throwing power and in closely adhering to the barrier layer; and performing a second plating process by immersing the substrate in a second plating solution having a composition superior in leveling ability.

With this method, a uniform initial plating layer without unplated areas on the side walls and bottom of the fine pits covered by the barrier layer is formed in the first plating process. A surface plating layer having a smooth surface and no void is formed on top of the initial plating layer in the second plating process.

According to another aspect of the present invention, the first plating solution is a copper pyrophosphate solution for printed circuit boards and the second plating solution is a copper sulfate solution. Due to the high polarization and the layered deposition property, the copper pyrophosphate sulfate solution forms a coating in close adherence with the barrier In layer 5 formed of TiN or the like. The copper sulfate plating solution having a high concentration of copper sulfate and a low concentration of sulfuric acid is superior in leveling ability. Hence, this process forms a plating layer free of voids in the fine pits covered by the barrier layer, and the surface of the plating layer is smooth.

According to another aspect of the present invention, the copper sulfate solution has a composition of 100–300 g/l of copper sulfate and 10–100 g/l of sulfuric acid.

According to another aspect of the present invention, a substrate plating apparatus comprises a plating bath; first plating solution supplying means for supplying a first plating solution having a composition superior in throwing power to the plating bath; second plating solution supplying means for supplying a second plating solution having a composition superior in leveling ability to the plating bath; and switching means for switching on and off the plating solutions supplied from the first and second plating solution supplying means.

With this construction, both the first and second plating processes can be performed in the same apparatus, since supply of plating solution is switched between processes, from the first plating solution superior in throwing power to the second plating solution superior in leveling.

According to another aspect of the present invention, the first plating solution has a composition with qualities superior for close adherence to a barrier layer formed on the surface of the substrate. With this construction, both the first and second plating processes can be performed in the same apparatus, since supply of plating solution is switched between processes, from the first plating solution superior in adherence to the barrier layer to the second plating solution superior in leveling.

BEST MODE FOR CARRYING OUT THE INVENTION

A substrate plating method and apparatus according to preferred embodiments of the present invention will be described while referring to the accompanying drawings.

A substrate plating method according to a first embodiment forms a copper plating on the surface of a semiconductor wafer in order to obtain a semiconductor device having wiring formed from the copper layer. This process is described with reference to FIGS. 1A–1C.

Figure 1A:
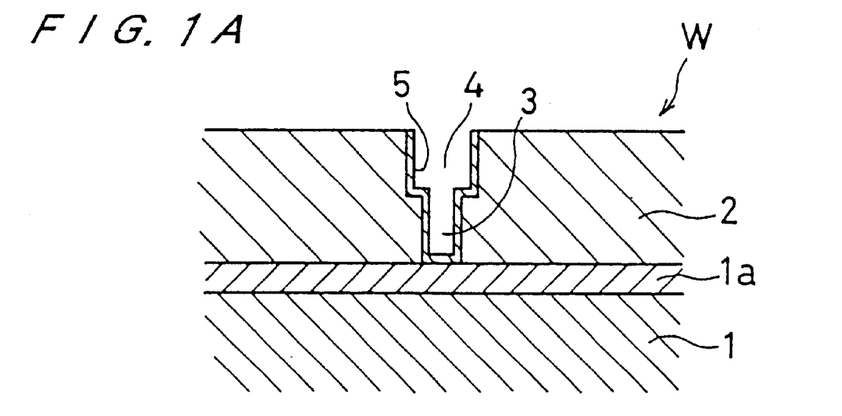
FIGS. 1A–1C are cross-sectional diagrams showing the process for manufacturing a semiconductor element according to the substrate plating method of the present invention.

As shown in FIG. 1A, a semiconductor wafer W is formed of a semiconductor material 1, a conducting layer 1$a$ formed on the top surface of the semiconductor material 1, and an $SiO_2$ insulating layer 2 deposited on top of the conducting layer 1$a$. A contact hole 3 and a channel 4 are formed in the insulating layer 2 by a lithography etching technique. A barrier layer 5, such as TiN, is formed over the surfaces in the contact hole 3 and channel 4.

Figure 1B:
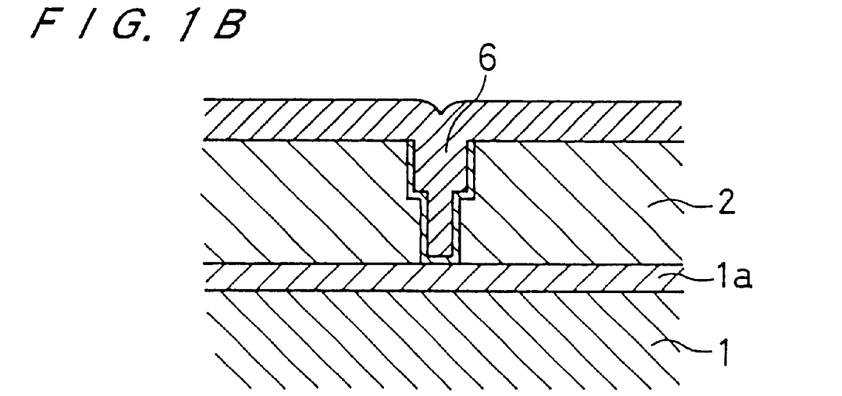
Figure 1C:
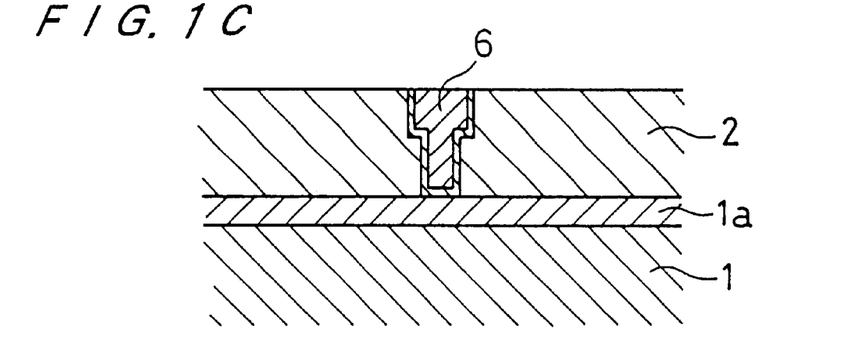

By performing a copper plating process on the surface of the semiconductor wafer W, the contact hole 3 and channel 4 are filled with a copper layer 6. The copper layer 6 is also deposited on top of the insulating layer 2. Next, chemical mechanical polishing (CMP) is performed to remove the copper layer 6 from the top of the insulating layer 2. This process is necessary to form the surface on the copper layer 6 filling the contact hole 3 and channel 4 to be approximately flush with the surface of the insulating layer 2. As a result, the copper layer 6 forms wiring, as shown in FIG. 1C.

Figure 2:
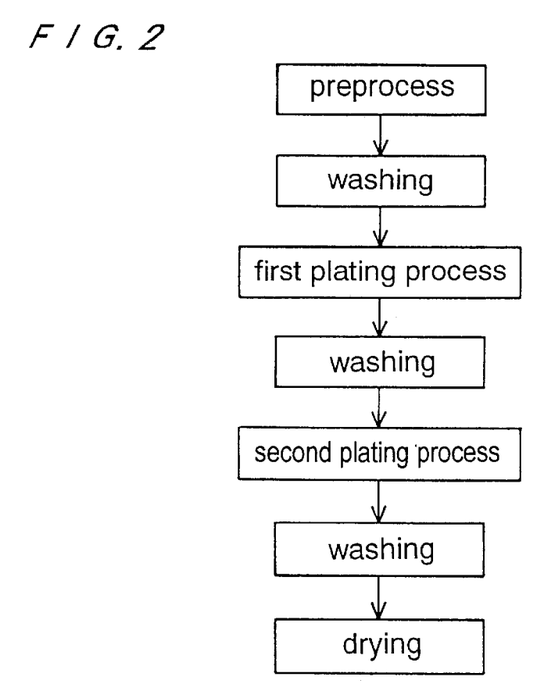
FIG. 2 is a flowchart showing the process of the plating method of the preferred embodiment.

Next, an electrolytic plating process for plating the semiconductor wafer W shown in FIG. 1A will be described with reference to FIG. 2. First, a preprocess is performed. In the preprocess, the semiconductor wafer W is immersed in an aqueous sulfuric acid solution to activate the semiconductor wafer W.

Figure 3A:
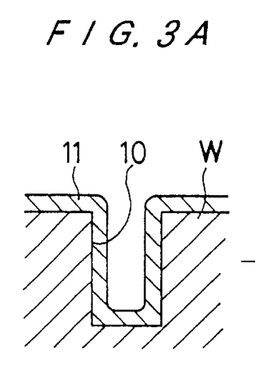
FIGS. 3A–3C are cross-sectional diagrams illustrating the process of FIG. 2.

After washing the semiconductor wafer W, a first plating process is performed by immersing the semiconductor wafer W into a first plating solution, such as a high throwing power copper sulfate plating solution used for printed circuit boards. As shown in FIG. 3A, this process forms a uniform initial plating layer 11 over the surface of a fine pit 10 formed in the semiconductor wafer W, wherein the surface includes the bottom and side walls of the fine pit 10. Here, the high throwing power copper sulfate solution has a low concentration of copper sulfate, a high concentration of sulfuric acid, and is superior in throwing power and coating uniformity. An example composition of this solution is 5–100 g/l of copper sulfate and 100–250 g/l of sulfuric acid.

Since the plating solution has a low concentration of copper sulfate and a high concentration of sulfuric acid, the conductivity of the solution is high and the polarization is great, thereby improving throwing power. As a result, plating metal is uniformly deposited on the surface of the semiconductor wafer W, eliminating unplated areas formed on the side and bottom surfaces of the fine pit 10.

Figure 3B:
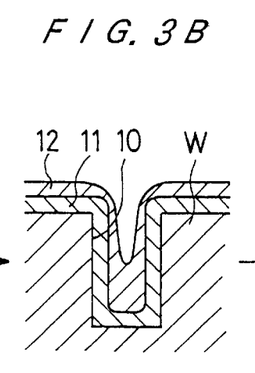
Figure 3C:
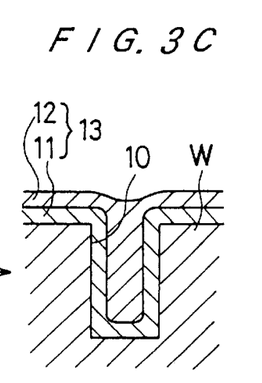

After again washing the semiconductor wafer W, a second plating process is performed by immersing the semiconductor wafer W into a second plating solution, such as a copper sulfate plating solution for decorative uses. As shown in FIGS. 3B and 3C, this process forms a plating layer 12 having a flat surface on the surface of the initial plating layer 11. Here, the copper sulfate plating solution has a high concentration of copper sulfate and a low concentration of sulfuric acid and is superior in leveling ability. An example composition of the solution is 100–300 g/l of copper sulfate and 10–100 g/l of sulfuric acid.

Figures 4A, 4B, 5:
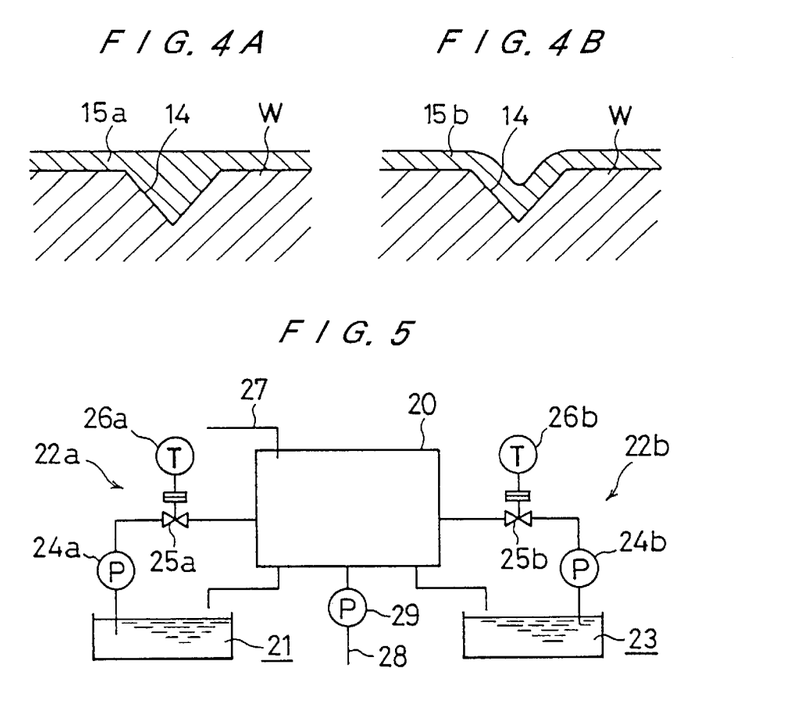
FIGS. 4A–4B are cross-sectional diagrams illustrating leveling ability.
FIG. 5 shows the general construction of a plating apparatus according to the preferred embodiment.

Here, leveling ability defines a quality describing the degree of smoothness on the plating surface. With good leveling ability, it is possible to obtain a plating layer 15a having a flat surface, as shown in FIG. 4A, even when a depression 14 is formed in the surface of the semiconductor wafer W. With a poor leveling ability, however, a plating layer 15b, as shown in FIG. 4B, is obtained. Here, the shape of the depression 14 formed in the surface of the semiconductor wafer W is reflected in the plating layer 15b.

Hence, when using a plating solution having superior leveling ability, film at the inlet to the fine pit 10 grows slow, as shown in FIG. 3B. This slow growth can prevent the generation of voids, thereby filling the fine pit 10 with a uniform layer of copper plating having no gaps. Moreover, it is possible to achieve a smooth surface on the plating.

Subsequently, the semiconductor wafer W is washed and dried to complete the plating process. This process achieves a plating layer 13 having a flat surface and free of voids. The fine pit 10 contains no unplated areas on its bottom or sidewalls.

FIG. 5 shows the construction of a plating apparatus suitable for the plating process described above.

The plating apparatus is provided with a plating bath 20; a first plating solution supplying section 22a for supplying a first plating solution 21 into the plating bath 20; and a second plating solution supplying section 22b for supplying a second plating solution 23 into the plating bath 20.

The first plating solution supplying section 22a includes a pump 24a for pumping first plating solution 21 into the plating bath 20; a shut-off valve 25a disposed upstream from the pump 24a; and a timer 26a for opening and closing the shut-off valve 25a.

Similarly, the second plating solution supplying section 22b includes a pump 24b for pumping second plating solution 23 into the plating bath 20; a shut-off valve 25b disposed upstream from the pump 24b; and a timer 26b for opening and closing the shut-off valve 25b.

In addition, a wash water supply tube 27 and a discharge tube 28 are connected to the plating bath 20 for introducing wash water into the plating bath 20 and discharging wash water out of the plating bath 20, respectively. A pump 29 is connected to the tube 28.

As described above, a semiconductor wafer W having undergone a preprocess, is inserted into the plating bath 20. Wash water is introduced into the plating bath 20 and the semiconductor wafer W is washed. Next, the shut-off valve 25a is opened according to the timer 26a. The first plating solution 21 is supplied into the plating bath 20, and the first plating process is performed. After a fixed time has elapsed, the shut-off valve 25a is closed. Wash water is again introduced into the plating bath 20 for washing the semiconductor wafer W. Subsequently, the shut-off valve 25b of the second plating solution supplying section 22b is opened according to timer 26b. The second plating solution 23 is supplied into the plating bath and the second plating process is performed. Accordingly, it is possible to perform both the first and second plating processes consecutively using the same apparatus.

In the example described above, a timer is used for switching the supply of plating solution on and off. However, it is obvious that any means capable of performing this process can be used.

Figure 9:
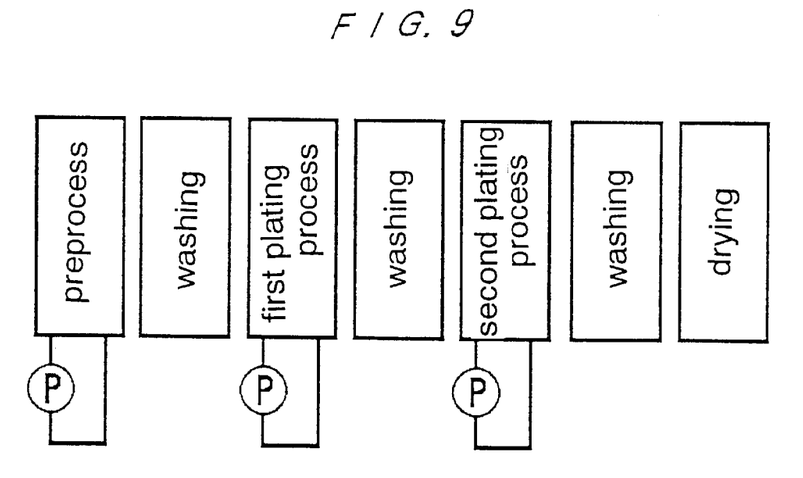
FIG. 9 is a flowchart showing the plating process employing a variation of the plating apparatus shown in FIG. 5.

In the example described above, the same processing tank is used for performing the first plating process, the second plating process, and the washing processes. However, these processes can be performed using separate baths for each process. As shown in FIG. 9, for example, multiple baths can be provided, wherein the plating process is performed by immersing the semiconductor wafer W into each bath in order according to each step of the process.

First Embodiment

In the first embodiment, the fine pit 10 having a width of 1.0 μm or less is formed on the semiconductor wafer W. An aqueous solution having 100 g/l of sulfuric acid is maintained at a temperature of 50° C. A preprocess is performed by immersing the semiconductor wafer W into the aqueous solution for 15 seconds. Subsequently, the first plating process is performed with the first plating solution and, after washing the semiconductor wafer W, the second plating process is performed using the second plating solution. The semiconductor wafer W is then washed and dried.

In Here, the composition of the first plating solution is as follows.

| | |
|---|---|
| $CUSO_4 \cdot 5H_2O$ | 70 g/l |
| $H_2SO_4$ | 200 g/l |
| NaCl | 100 mg/l |
| Organic additive | 5 ml/l |

The composition of the second plating solution is as follows.

| | |
|---|---|
| $CuSO_4 \cdot 5H_2O$ | 200 g/l |
| $H_2SO_4$ | 50 g/l |
| NaCl | 100 mg/l |
| Organic additive | 5 ml/l |

The conditions for the plating processes, described below, are the same for both processes.

| | |
|---|---|
| Bath temperature | 25° C. |
| Current density | 2 A/dm$^2$ |
| Plating time | 2.5 min. |
| PH | < 1 |

Figure 6A:
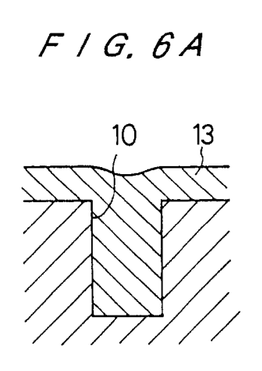
FIGS. 6A–6C are cross-sectional diagrams showing the differences based on first and second comparisons to the first embodiment.

This process forms the plating layer 13 free of voids in the fine pit 10, as shown in FIG. 6A. No unplated areas are developed in the fine pit 10.

(First Comparison)

Figure 6B:
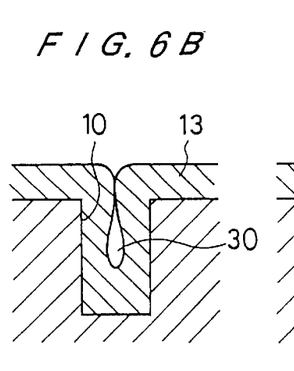

In a first comparison to the first embodiment, a semiconductor wafer W having undergone the same preprocess described above is plated using only the first plating solution. As shown in FIG. 6B, a void 30 is formed in the plating layer 13 within the fine pit 10.

(Second Comparison)

Figure 6C:
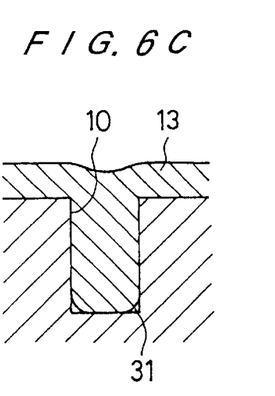

In a second comparison to the first embodiment, a semiconductor wafer W having undergone the same preprocess described above is plated using only the second plating solution. As shown in FIG. 6c, an unplated area 31 exists in a bottom corner of the fine pit 10.

Next, a second embodiment of the present invention will be described.

As shown in FIG. 1A, a semiconductor wafer W is formed of a semiconductor material 1, a conducting layer 1a formed on the top surface of the semiconductor material 1, and an $SiO_2$ insulating layer 2 deposited on top of the conducting layer 1a. A contact hole 3 and a channel 4 are formed in the insulating layer 2 by a lithography etching technique. A barrier layer 5, such as TiN, is formed over the surfaces in the contact hole 3 and channel 4.

Figure 7A:
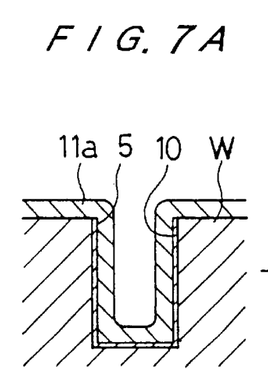
FIGS. 7A–7C are cross-sectional diagrams illustrating the process of the plating method according to the second embodiment.

First, a preprocess is performed. In the preprocess, the semiconductor wafer W is immersed in an aqueous sulfuric acid solution to activate the semiconductor wafer W. After washing the semiconductor wafer W, a first plating process is performed by immersing the semiconductor wafer W into a first plating solution, such as a copper pyrophosphate solution. As shown in FIG. 7A, this process forms a uniform initial plating layer 11 over the surface including the barrier layer 5. The barrier layer 5 covers the bottom and side walls of a fine pit 10 formed in the semiconductor wafer W.

Here, the copper pyrophosphate sulfate solution forms a layered deposition providing superior close adherence with the barrier layer 5. Hence, this process forms an initial plating layer 11a having a throwing power and prevents the generation of unplated areas on the barrier layer 5 covering the fine pit 10.

Figure 7B:
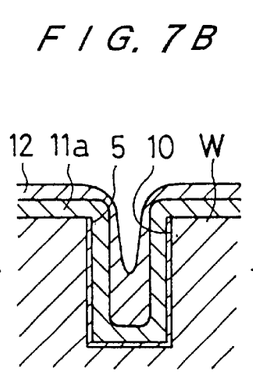
Figure 7C:
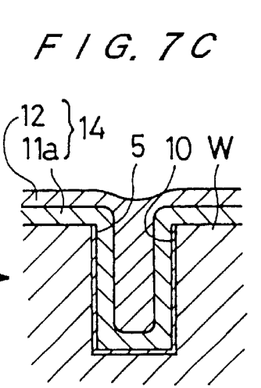

After washing the semiconductor wafer W, a second plating process is performed by immersing the semiconductor wafer W into a second plating solution, such as a copper sulfate plating solution. As shown in FIGS. 7B and 7C, this process forms a plating layer 12 having a flat surface on the surface of the initial plating layer 11a. Here, the copper sulfate plating solution has a high concentration of copper sulfate and a low concentration of sulfuric acid and is superior in leveling ability. An example composition of the solution is 100–300 g/l of copper sulfate and 10–100 g/l of sulfuric acid.

Second Embodiment

In the second embodiment, the fine pit 10 having a width of 1.0 μm or less is formed on the semiconductor wafer W. The barrier layer 5 covers the fine pit 10. An aqueous solution having 100 g/l of sulfuric acid is maintained at a temperature of 50° C. A preprocess is performed by immersing the semiconductor wafer W into the aqueous solution for 15 seconds. Subsequently, the first plating process is performed with the first plating solution and, after washing the semiconductor wafer W, the second plating process is performed using the second plating solution. The semiconductor wafer W is then washed and dried.

Here, the composition of the first plating solution is as follows.

| | |
|---|---|
| $Cu_2P_2O_7 \cdot 3H_2O$ | 90 g/l |
| $H_4P_2O_7$ | 340 g/l |
| Ammonia | 3 ml/l |
| Organic additive | 0.5 ml/l |

The conditions for the plating process are as follows.

| | |
|---|---|
| Bath temperature | 55° C. |
| Current density | 0.5 A/dm$^2$ |
| Plating time | 3 min. |
| PH 8.5 | |

The composition of the second plating solution is as follows.

| | |
|---|---|
| $CuSO_4 \cdot 5H_2O$ | 200 g/l |
| $H_2SO_4$ | 50 g/l |
| NaCl | 100 mg/l |
| Organic additive | 5 ml/l |

The conditions for the plating process are as follows.

| | |
|---|---|
| Bath temperature | 25° C. |
| Current density | 2 A/dm$^2$ |
| Plating time | 2.5 min. |
| PH < 1 | |

Figure 8A:
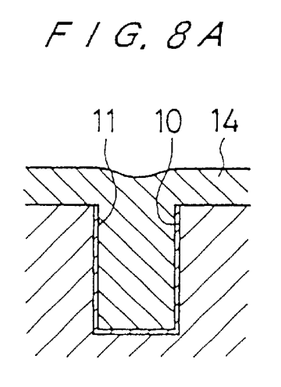
FIGS. 8A–8C are cross-sectional diagrams showing the differences based on first and second comparisons to the second embodiment.

This process forms a plating layer 14 free of voids in the fine pit 10, as shown in FIG. 8A. No unplated areas are developed on the barrier layer 5 within the fine pit 10.

(First Comparison)

Figure 8B:
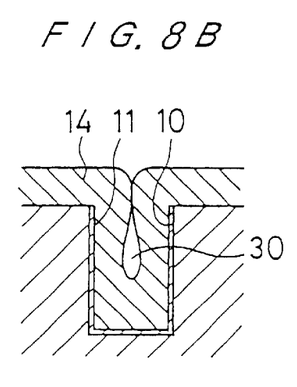

In a first comparison to the first embodiment, a semiconductor wafer W having undergone the same preprocess described above is plated using only the first plating solution. As shown in FIG. 8B, a void 30 is formed in the plating layer 14 within the fine pit 10.

(Second Comparison)

Figure 8C:
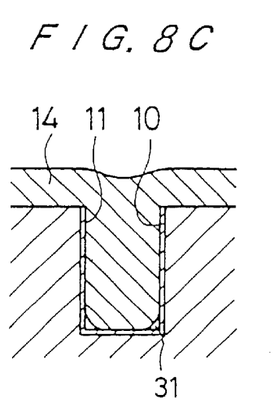

In a second comparison to the first embodiment, a semiconductor wafer W having undergone the same preprocess described above is plated using only the second plating solution. As shown in FIG. 8C, an unplated area 31 exists on the barrier layer 5 in a bottom corner of the fine pit 10.

In the first plating process of the present invention described above, a uniform initial plating layer without unplated areas on the side walls and bottom of the fine pit 10 is formed. In the second plating process of the present invention, a surface plating layer having a smooth surface and no void is formed on top of the initial plating layer. Accordingly, fine pits formed in the substrate, such as fine channels for wiring, can be filled with a copper, copper alloy, or other material having low electrical resistance without gaps in the metal plating and with an level surface.

Industrial Applicability

The present invention is a plating process capable of forming embedded wiring layers and the like in semiconductor wafers and can be applied to the fabrication of LSI chips and other semiconductor devices.

What is claimed is:

1. A method for plating a substrate, comprising:
   providing a substrate having a plurality of fine pits which are covered with a barrier layer;

plating a first plating layer directly on the entire surface of the barrier layer covering within the fine pits using a first plating solution; and plating a second plating layer within the fine pits on the first plating layer using a second plating solution.

2. The method of claim 1, wherein the second plating solution is different in composition from the first plating solution.

3. A method for plating a substrate, comprising:

providing a substrate having a plurality of fine pits which are covered with a barrier layer, plating a first plating layer directly on the entire surface of the barrier layer covering within the fine pits using a first plating solution, and filling the fine pits covered by the first plating layer with a second plating layer through a second plating process using a second plating solution.

4. The method of any one of claims 1 and 3, wherein the first plating solution comprises copper sulfate.

5. The method of any one of claims 1 and 3, wherein the first plating solution comprises copper pyrophosphate.

6. The method of any one of claims 1 and 3, wherein the second plating solution comprises copper sulfate.

7. A method for plating a substrate, comprising:

applying an inner plating layer to a substrate having a plurality of fine pits which are covered with a barrier layer using a copper pyrophosphate plating solution; and applying a subsequent plating layer on the inner plating layer using a copper sulfate plating solution.

8. A method for plating a substrate, comprising:

providing a substrate having a plurality of fine pits having a barrier layer;

plating the fine pits by using a copper pyrophosphate plating solution; and plating the fine pits by using a second plating solution comprising copper sulfate.

9. The method of claim 8, wherein the second plating solution comprises 100–300 g/l copper sulfate.

10. The method of claim 8, wherein the second plating solution comprises 10–100 g/l sulfuric acid.

11. The method of claim 8, wherein the second plating solution comprises 100–300 g/l copper sulfate and 10–100 g/l sulfuric acid.

12. A method for plating a substrate, comprising:

providing a substrate having fine pits having a barrier layer;

plating the fine pits by using a first plating solution comprising copper sulfate; and plating the fine pits by using a second plating solution comprising 100–300 g/l copper sulfate.

13. The method of claim 12, wherein the first plating solution comprises 100–250 g/l sulfuric acid.

14. The method of claim 12, wherein the first plating solution comprises 5–100 g/l copper sulfate and 100–250 g/l sulfuric acid.

15. The method of claim 12, wherein the second plating solution comprises 100–300 g/l copper sulfate and 10–100 g/l sulfuric acid.

16. The method of any one of claims 1, 3, 7, 8 and 12, wherein the first plating layer is plated directly to the barrier layer by the process of plating the first plating layer.

17. The method of claims 1, 3, 7, 8, and 12, wherein the first plating solution has a greater ability to adhere to the barrier layer than the second plating solution.

18. The method of any one of claims 1, 3, 7, 8 and 12, wherein the first plating layer and the second plating layer are metal layers.

19. The method of any one of claims 1, 3, 7, 8 and 12, wherein the first plating layer and the second plating layer are substantially of the same composition.

20. The method of claim 19, wherein the first plating layer and the second plating layer are substantially of copper.

21. The method of any one of claims 1, 3, 7, 8 and 12, wherein the first plating layer and the second plating layer integrally form a wiring layer.

22. The method of any one of claims 1, 3, 7, 8 and 12, wherein the fine pits include a contact hole or channel.

23. The method of any one of claims 1, 3, 7, 8 and 12, wherein the first plating solution has a smaller leveling ability than the second plating solution such that said plating a first plating layer results in the first plating layer having the shape of a depression formed in the surface of the substrate.

24. The method of any one of claims 1, 3, 7, 8 and 12, wherein the barrier layer is coated with the first plating layer such that there is no unplated area within the fine pits.

25. The method of any one of claims 1, 3, 7, 8 and 12, wherein the barrier layer is coated with the first plating layer such that the first plating layer forms a uniform initial layer within the fine pits.

26. The method of any one of claims 1, 3, 7, 8 and 12, wherein plating the first plating layer comprises electroplating.

27. The method of claim 26, wherein the first plating solution is an electroplating solution.

28. The method of any one of claims 1, 3, 7, 8 and 12, wherein plating the second plating layer comprises electroplating.

29. The method of claim 28, wherein the second plating solution is an electroplating solution.

30. The method of any one of claims 1, 3, 7, 8 and 12, wherein each of the fine pits has side walls and a bottom wall which are entirely covered with the barrier layer, and the first plating layer covers the entire barrier layer covering the side walls and bottom wall of each fine pit.

31. The method of any one of claims 1, 3, 7, 8 and 12, wherein plating the first plating layer and the second plating layer comprise immersing the substrate in the first plating solution and second plating solution, respectively.

32. The method of any one claims 1, 3, 7, 8 and 12, wherein the substrate is a semiconductor wafer.

33. The method of claim 1, 3, 7, 8 and 12, wherein the first plating solution has a higher throwing power than the second plating solution and has a greater ability to adhere to the barrier layer than the second plating solution.

34. The method of claim 1, 3, 7, 8 and 12, wherein the second plating solution has a greater leveling ability than the first plating solution.

35. The method of any of claims 1, 3, 7, 8 and 12, wherein the barrier layer has a surface entirely exposed and free of deposit, and the first metal layer is directly plated on the surface entirely exposed and free of deposit.

36. The method of any one of claims 1, 3, 7, 8 and 12, wherein the barrier layer is free of deposit immediately prior to the plating of the first plating layer.

37. The method of claim 1, 3, 7, 8 and 12, wherein the second plating layer substantially fills the fine pits covered by the first plating layer.

38. The method of claim 1, 3, 7, 8 and 12, wherein first plating layer forms a substantially uniform coating on the barrier layer.

39. The method of any one of claims 1, 3, 7, 8 and 12, wherein the first plating solution is an alkaline plating solution.

40. The method of any one of claims 1, 3, 7, 8 and 12, wherein the first plating solution has a higher adhesive metal deposition property than the second plating solution such that said plating a first plating layer results in the first plating layer forming a substantially uniform coating on the barrier layer.

41. The method of any one of claims 1, 3, 7, 8 and 12, wherein the second plating layer comprises a smooth surface and no void.

42. The method of any one of claims 1, 3, and 12, wherein the first plating solution comprises sulfuric acid.

43. The method of any one of claims 1, 3, and 12, wherein the first plating solution comprises copper sulfate and sulfuric acid.

44. The method of any one of claims 1, 3, and 12, wherein the first plating solution comprises 5–100 g/l copper sulfate.

45. The method of any one of claims 1, 3, and 12, wherein the first plating solution comprise 100–250 g/l sulfuric acid.

46. The method of any one of claims 1, 3, and 12, wherein the first plating solution comprises 5–100 g/l copper sulfate and 100–250 g/l sulfuric acid.

47. The method of any one of claims 1, 3, 7, 8 and 12, wherein the second plating solution comprises sulfuric acid.

48. The method of any one of claims 1, 3, 7, 8 and 12, wherein the second plating solution comprises copper sulfate and sulfuric acid.

49. The method of any one of claims 1, 3, 7 and 8, wherein the second plating solution comprises 100–300 g/l copper sulfate.

50. The method of any one of claims 1, 3, 7, 8 and 12, wherein the second plating solution comprises 10–100 g/l sulfuric acid.

51. The method of any one of claims 1, 3, 7 and 8, wherein the second plating solution comprises 100–300 g/l copper sulfate and 10–100 g/l sulfuric acid.

52. The method of any one of claims 1, 3, 7, 8 and 12, wherein the barrier layer is TiN or TaN.

53. The method of any one of claims 1, 3, 7, 8 and 12, wherein the substrate/semiconductor wafer is washed between the first and second plating steps.

54. The method of any one of claims 1, 3, 7, 8 and 12, wherein the first plating solution further contains NaCl.

55. The method of any of claims 1, 3, 7, 8 and 12, wherein the first plating solution further contains an organic additive.

56. The method of any one of claims 1, 3, 7, 8 and 12, wherein the second plating solution further contains NaCl.

57. The method of any one of claims 1, 3, 7, 8 and 12, wherein the second plating solution further contains an organic additive.

58. The method of any one of claims 1, 3, and 12, wherein the first plating step is conducted at a pH of less than 1.

59. The method of any one of claims 1, 3, 7, 8 and 12, wherein the second plating step is conducted at a pH of less than 1.

60. The method of any one of claims 1, 3, 7, 8 and 12, wherein the fine pits have a width of 1.0 micron or less.

61. The method of any one of claims 1, 3, 7, 8 and 12, wherein before the first plating step, the substrate is subjected to a preprocess by immersing the substrate in an aqueous sulfuric acid solution.

62. The method of any one of claims 1, 3, and 12, wherein the first plating layer and the second plating layer are formed at substantially the same temperature at substantially the same current density.

63. The method of any one of claims 1, 3, 7, 8 and 12, further comprising chemical mechanical polishing the substrate after plating the second plating layer.

64. The method of any one of claims 1, 3, 7, 8 and 12, further comprising washing and drying the substrate after plating the second plating layer.

65. The method of any one of claims 1, 3, 8 and 12, wherein said providing includes providing the substrate such that the barrier layer covers both the bottom and sides of the fine pits.

66. The method of any one of claims 1, 3, 8 and 12, wherein said providing includes providing the substrate such that the barrier layer covers all of the bottom and sides of the fine pits.

67. The method of any one of claims 7, 8 and 12, wherein said first plating layer is plated on the entire surface of the barrier layer.

68. The method of any one of claims 7, 8 and 12, wherein the first plating solution has a higher throwing power than the second plating solution and the second plating solution has a higher leveling ability than the first plating solution.

69. A method for plating a substrate, comprising:
providing a substrate having a plurality of fine pits which are covered with a barrier layer;
plating a first plating layer on the entire surface of the barrier layer covering within the fine pits using a first plating solution without using a seed layer; and
plating a second plating layer within the fine pits on the first plating layer using a second plating solution.

70. A method for plating a substrate, comprising:
providing a substrate having a plurality of fine pits which are covered with a barrier layer,
plating a first plating layer on the entire surface of the barrier layer covering within the fine pits using a first plating solution without using a seed layer, and
filling the fine pits covered by the first plating layer with a second plating layer through a second plating process using a second plating solution.

71. The method of any one of claims 1, 3, 69 and 70, further comprising washing and drying the substrate after the second plating.

72. The method of claim 71, wherein the second plating solution comprises copper sulfate.

73. The method of claim 71, wherein the fine pits are filled with a copper or copper alloy.

74. The method of claim 71, further comprising washing the substrate between the first plating and the second plating.

75. The method of claim 74, wherein the second plating is performed by electrolytic plating.

76. The method of claim 75, wherein the second plating solution has a higher leveling ability than the first plating solution.

77. The method of claim 76, wherein the first plating solution has a higher throwing power than the second plating solution.

78. The method of claim 77, wherein the first plating is performed by electrolytic plating.

79. The method of claim 77, further comprising chemical mechanical polishing of the substrate after the second plating.

80. A method for plating a substrate, comprising:
providing a substrate having a plurality of fine pits which are covered with a barrier layer;
performing a first plating process using a first plating solution so as to form a first plating layer directly on the entire surface of the barrier layer covering within the fine pits; and
plating a second plating layer within the fine pits on the first plating layer by a second plating process using a second plating solution.

81. The method of claim 80, further comprising washing and drying the substrate after the second plating process.

82. The method of claim 81, wherein the first plating layer comprises a copper plating layer.

83. The method of claim 81, wherein the second plating layer is plated with a copper or copper alloy.

84. The method of claim 81, further comprising washing the substrate between the first plating process and the second plating process.

85. The method of claim 82, wherein the second plating process is performed by electrolytic plating.

86. The method of claim 83, wherein the first plating process is performed by electrolytic plating.

87. The method of claim 83, further comprising chemical mechanical polishing of the substrate after the second plating process.

88. A method for plating a substrate, comprising:
providing a substrate having a plurality of fine pits which are covered with a barrier layer;
performing a first plating process using a first plating solution so as to form a first plating layer on the surface of the barrier layer covering within the fine pits without using a seed layer; and
filling the fine pits covered by the first plating layer with a second plating layer by a second plating process using a second plating solution.

89. The method of claim 88, further comprising washing and drying the substrate after the second plating.

90. The method of claim 80, wherein the second plating solution comprises copper sulfate.

91. The method of claim 80, wherein the fine pits are filled with a copper or copper alloy.

92. The method of any one of claims 89, 90 and 91, further comprising washing the substrate between the first plating process and the second plating process.

93. The method of claim 92, wherein the second plating process is performed by electrolytic plating.

94. The method of claim 93, wherein the first plating process is performed by electrolytic plating.

95. The method of claim 94, further comprising chemical mechanical polishing of the substrate after the second plating process.

96. A method for plating a substrate, comprising:
providing a substrate having a plurality of fine pits which are covered with a barrier layer;
plating a first plating layer on the surface of the barrier layer covering within the fine pits using a first plating solution without any layer between the barrier layer and the first plating layer; and
plating a second plating layer within the fine pits on the first plating layer using a second plating solution.

97. A method for plating a substrate, comprising:
providing a substrate having a plurality of fine pits which are covered with a barrier layer;
plating a first plating layer on the surface of the barrier layer covering within the fine pits using a first plating solution without any layer between the barrier layer and the first plating layer; and
filling the fine pits covered by the first plating layer with a second plating layer through a second plating process using a second plating solution.

98. The method of any one of claims 96 and 97, further comprising washing and drying the substrate after the second plating.

99. The method of claim 98, wherein the second plating solution comprises copper sulfate.

100. The method of claim 98, wherein the fine pits are filled with a copper or copper alloy.

101. The method of claim 98 further comprising washing the substrate between the first plating and the second plating.

102. The method of claim 101, wherein the second plating is performed by electrolytic plating.

103. The method of claim 97, wherein the second plating solution has a higher leveling ability than the first plating solution.

104. The method of claim 103, wherein the first plating solution has a higher throwing power than the second plating solution.

105. The method of claim 104, wherein the first plating is performed by electrolytic plating.

106. The method of claim 104, further comprising chemical mechanical polishing of the substrate after the second plating.

107. A method for plating a substrate, comprising:
providing a substrate having a plurality of fine pits which are covered with a barrier layer;
forming a first plating layer directly on the entire surface of the barrier layer covering within the fine pits by a first plating process using a first plating solution; and
plating a second plating layer within the fine pits on the first plating layer by a second plating process using a second plating solution.

108. A method for plating a substrate, comprising:
providing a substrate having a plurality of fine pits which are covered with a barrier layer;
plating a first plating layer directly on the entire surface of the barrier layer covering within the fine pits by a first plating process using a first plating solution; and
plating a second plating layer within the fine pits on the first plating layer by a second plating process using a second plating solution.

109. A method for plating a substrate, comprising:
providing a substrate having a plurality of fine pits which are covered with a barrier layer;
plating a first plating layer on the surface of the barrier layer covering within the fine pits by a first plating process using a first plating solution without using a seed layer; and
filling the fine pits covered by the first plating layer with a second plating layer by a second plating process using a second plating solution.

110. The method of claim 72, further comprising washing the substrate between the first plating and the second plating.

111. The method of claim 110, wherein the second plating is performed by electrolytic plating.

112. The method of claim 111, wherein the second plating solution has a higher leveling ability than the first plating solution.

113. The method of claim 112, wherein the first plating solution has a higher throwing power than the second plating solution.

114. The method of claim 113, wherein the first plating is performed by electrolytic plating.

115. The method of claim 113, further comprising chemical mechanical polishing of the substrate after the second plating.

116. The method of claim 73, further comprising washing the substrate between the first plating and the second plating.

117. The method of claim 116, wherein the second plating is performed by electrolytic plating.

118. The method of claim 117, wherein the second plating solution has a higher leveling ability than the first plating solution.

119. The method of claim 118, wherein the first plating solution has a higher throwing power than the second plating solution.

120. The method of claim 119, wherein the first plating is performed by electrolytic plating.

121. The method of claim 119, further comprising chemical mechanical polishing of the substrate after the second plating.

122. The method of claim 91, further comprising washing the substrate between the first plating and the second plating.

123. The method of claim 122, wherein the second plating is performed by electrolytic plating.

124. The method of claim 100, further comprising washing the substrate between the first plating and the second plating.

125. The method of claim 124, wherein the second plating is performed by electrolytic plating.

* * * * *